(12) United States Patent
Robin et al.

(10) Patent No.: US 10,439,618 B2
(45) Date of Patent: Oct. 8, 2019

(54) BY ODD INTEGER DIGITAL FREQUENCY DIVIDER CIRCUIT AND METHOD

(71) Applicant: NXP USA, Inc., Austin, TX (US)

(72) Inventors: Thierry Robin, Plaisance du Touch (FR); Bernard Pierre Francois Pechaud, Clermont-le-Fort (FR); Domenico Desposito, Toulouse (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/196,426

(22) Filed: Nov. 20, 2018

(65) Prior Publication Data

US 2019/0199356 A1    Jun. 27, 2019

(30) Foreign Application Priority Data

Dec. 22, 2017 (EP) .................................. 17306893

(51) Int. Cl.
*H03K 21/00* (2006.01)
*H03K 23/50* (2006.01)
*H03K 21/02* (2006.01)
*H03K 23/00* (2006.01)

(52) U.S. Cl.
CPC ......... *H03K 23/505* (2013.01); *H03K 21/026* (2013.01); *H03K 23/005* (2013.01)

(58) Field of Classification Search
CPC ... H03K 23/505; H03K 21/026; H03K 23/005
USPC ................................................ 327/115–122
See application file for complete search history.

(56) References Cited

U.S. PATENT DOCUMENTS

| 4,348,640 | A | 9/1982 | Clendening |
| 6,566,918 | B1 | 5/2003 | Nguyen |
| 6,876,710 | B1 * | 4/2005 | Pitzer ................... H03L 7/0814 332/103 |
| 7,012,985 | B1 * | 3/2006 | Nix ........................ H03K 23/42 327/117 |
| 8,558,589 | B2 | 10/2013 | Dahan et al. |
| 10,205,459 | B2 * | 2/2019 | Huang ................... H03L 7/081 |
| 2005/0212570 | A1 | 9/2005 | Sun et al. |
| 2008/0297209 | A1 | 12/2008 | Scuteri |

* cited by examiner

*Primary Examiner* — Dinh T Le
(74) *Attorney, Agent, or Firm* — Charlene R. Jacobsen

(57) ABSTRACT

The present application relates to a circuit of a frequency divider arranged to divide a frequency of an input clock signal by odd integer N and a method of operating the circuit. A shift register comprises a number of N+1 clock gating cells, which are connected in series to each other, and a shift logic. An input clock signal is fed into clock signal inputs of each one of the number of N+1 clock gating cells. The shift logic is configured to receive enable signals from a set of the number of N+1 clock gating cells and to generate a feedback signal, which is supplied to a gate enable input of the first one of the number of N+1 clock gating cells. A multiplexer is configured to receive at input ports N+1 gated clock signals and to output a rotation clock signal, which has a frequency of 2/N of the frequency of the input clock signal. A frequency generator is configured to receive the rotation clock signal and to generate an output clock signal having a frequency of 1/N.

15 Claims, 9 Drawing Sheets

BY ODD INTEGER DIGITAL FREQUENCY DIVIDER CIRCUIT AND METHOD

CROSS-REFERENCE TO RELATED APPLICATIONS

This application claims the priority under 35 U.S.C. § 119 of European patent application no. 17306893.3, filed Dec. 22, 2017 the contents of which are incorporated by reference herein.

FIELD OF THE INVENTION

The present disclosure relates generally to frequency divider circuit, in particular to a clock signal divider circuit and more particularly, a clock signal divider circuit configured for dividing a clock signal frequency by odd integer.

BACKGROUND

Digital frequency circuits such as synthesizers, filters and phase locked loops many times require output frequencies which have a 50/50 duty cycle and are of odd frequency multiples. In the prior art, where a common clock frequency was used it was very difficult to provide if at all a divider circuit which would maintain the original symmetry or 50/50 duty cycle of the master clock frequency when it was necessary to divide down by an odd multiple. Output waveforms having a 50/50 duty cycle duration are advantageous from a frequency filtering standpoint since they will have a spectral distribution consisting only of odd harmonics.

SUMMARY

The present invention provides a circuit of a frequency divider arranged to divide a frequency of an input clock signal by odd integer N and a method of dividing a frequency of an input clock signal ($Clk_{in}$) by odd integer N as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION

Figure 1:
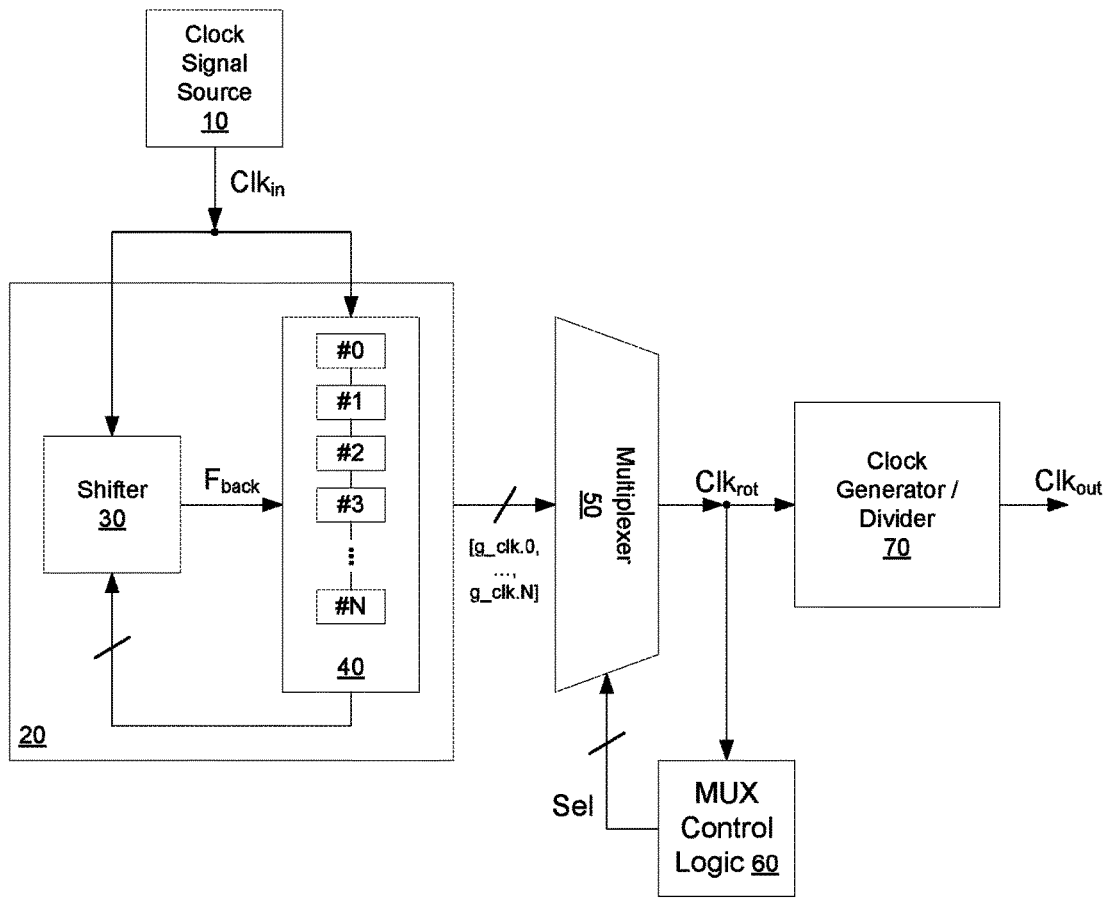
FIG. 1 schematically illustrates a block diagram of a clock signal divider by odd integer according to an example of the present invention.

Embodiments of the present disclosure will be described below in detail with reference to drawings. Note that the same reference numerals are used to represent identical or equivalent elements in figures, and the description thereof will not be repeated. The embodiments set forth below represent the necessary information to enable those skilled in the art to practice the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Referring first to FIG. 1, a block diagram of a circuitry of a clock signal divider by an odd integer is schematically illustrated. The circuitry comprises feedback shift register 20 with a linear register 40 and a shift logic 30. The linear register comprises a plurality of N+1 clock gating cells, which are interconnected in series with each other. Each of the clock gating cell of the linear register receives an input clock signal $Clk_{in}$, which is provided by a clock source 10, and provides a gated clock signal. Each second clock gating cell is provided with an inverter, through which the input clock signal $Clk_{in}$ is first passed before being input to the respective second clock gating cells. The gated clock signals g_clk.0 to g_clk.N each one generated by a respective one of the plurality of N+1 clock gating cells, are supplied to input ports of a multiplexer 50, which selectively connects one of the input ports to its output thereby generating a rotation clock $Clk_{rot}$ signal. The selective connectivity of the input ports to the output of the multiplexer is under control of a multiplexer control logic 60. The rotation clock $Clk_{rot}$ signal present at the output of the multiplexer is composed in sections of the gated clock signals g_clk.0 to g_clk.N. The operation of the multiplexer control logic 60 is triggered by the rotation clock $Clk_{rot}$ signal present at the output of the multiplexer 50. Further, a clock generator 70, which may be a clock divider and in particular a clock divider by two, generates an output clock signal $Clk_{out}$ based on the rotation clock $Clk_{rot}$.

As those skilled in the art will understand more fully from the following description, the clock gating cells are connected in series via the gate enable input and enable signal output. The shift logic 30 implements a feedback path and is configured to generate a feedback signal $F_{back}$ on the basis of a predefined set of enable signals provided by a respective predefined set of clock gating cells of the linear register 40. The feedback signal $F_{back}$ is supplied to the first clock gating cell of the linear register 40. In particular, the feedback signal $F_{back}$ is provided to the gate enable input of the first clock gating cell. In an example, the predefined set of enable signals comprises the first N−3 clock gating cells of the linear register 40. In an example, the shift logic 30 comprises an NOR gate, at which the set of enable signals are logically combined and a gated latch, which is clocked by the input clock signal $Clk_{in}$ and which provided the generated feedback signal $F_{back}$ at its output.

Figure 2:
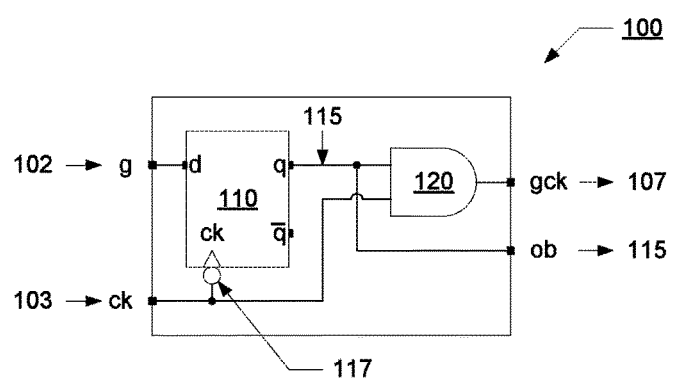
FIG. 2 schematically illustrates a block diagram of clock gating cell according to an example of the present invention.

Referring now to FIG. 2, block diagram of clock gating cell according to an example of the present invention is schematically illustrated.

The clock gating cell 100 has a gate enable input "g" and a clock signal input "ck" configured to receive gate signal 102 and clock input signal 103, respectively. The clock gating cell 100 also has a gated clock signal output "gck" that is configured to output a gated clock signal 107 as a function of states of the gate enable signal 102 and the clock signal 103. The clock gating cell 100 further has an enable signal output "ob" that is configured to output a latch enable signal 115 as a function of the gate signal 102. The clock gating cell 100 may be a cell such as may be employed in the design of an ASIC.

The clock gating cell 100 has an internal circuitry, which comprises a latch 110, such as gated latch or gated flipflop, although other latches are well within the scope of the present invention. The latch 110 also has an inverter 117, which inverts a high clock input signal 103 to low, and a low clock input signal 103 to high. The latch 110 allows the gate enable signal 102 to pass through the latch 110 to a latch enable signal 115 when the latch is enabled (i.e. due to the inverter 117, when the clock input signal 103 is low), but the latch 110 freezes the latch enable signal 115 at its last output value when the latch 110 is disabled (i.e. due to the inverter 117, when the clock input signal 103 is high).

The internal circuitry also comprises an AND gate 120. The AND gate 120 is a source within the internal circuitry, and ultimately a source of the clock gating cell 100 of the gated clock signal output gck. The AND gate 120 is arranged to combine the latch enable signal 115 and the clock input signal 103. This combinatorial AND logic, of combining within the AND gate 120 the clock input signal 103 and the latch enable signal 115, generates the gated clock signal 107 directly from the clock input signal 103. In a further embodiment, the combinatorial logic within the AND gate 120 is configured to generate the gated clock signal 107 from the latch enable signal 115 and the clock input signal 103.

The embodiment illustrated in FIG. 2 comprises a D latch or D flipflop 110 with a data input "d" and an enable signal input "ck", which is also referred to as clock input or control input. The gate enable input "g" of the clock gating cell 100 is connected to the data input "d" of the D flipflop 110 and the clock signal input "ck" is connected via the inverter 117 to the clock input "ck" of the D flipflop 110. The inverter 117 is connected in series between the clock signal input "ck" of the clock gating cell 100 and the clock input "ck" of the D flipflop 110. The output "q" of the D flipflop is connected to the AND gate 120 and the enable signal output "ob" of the clock gating cell 100.

Figure 3:
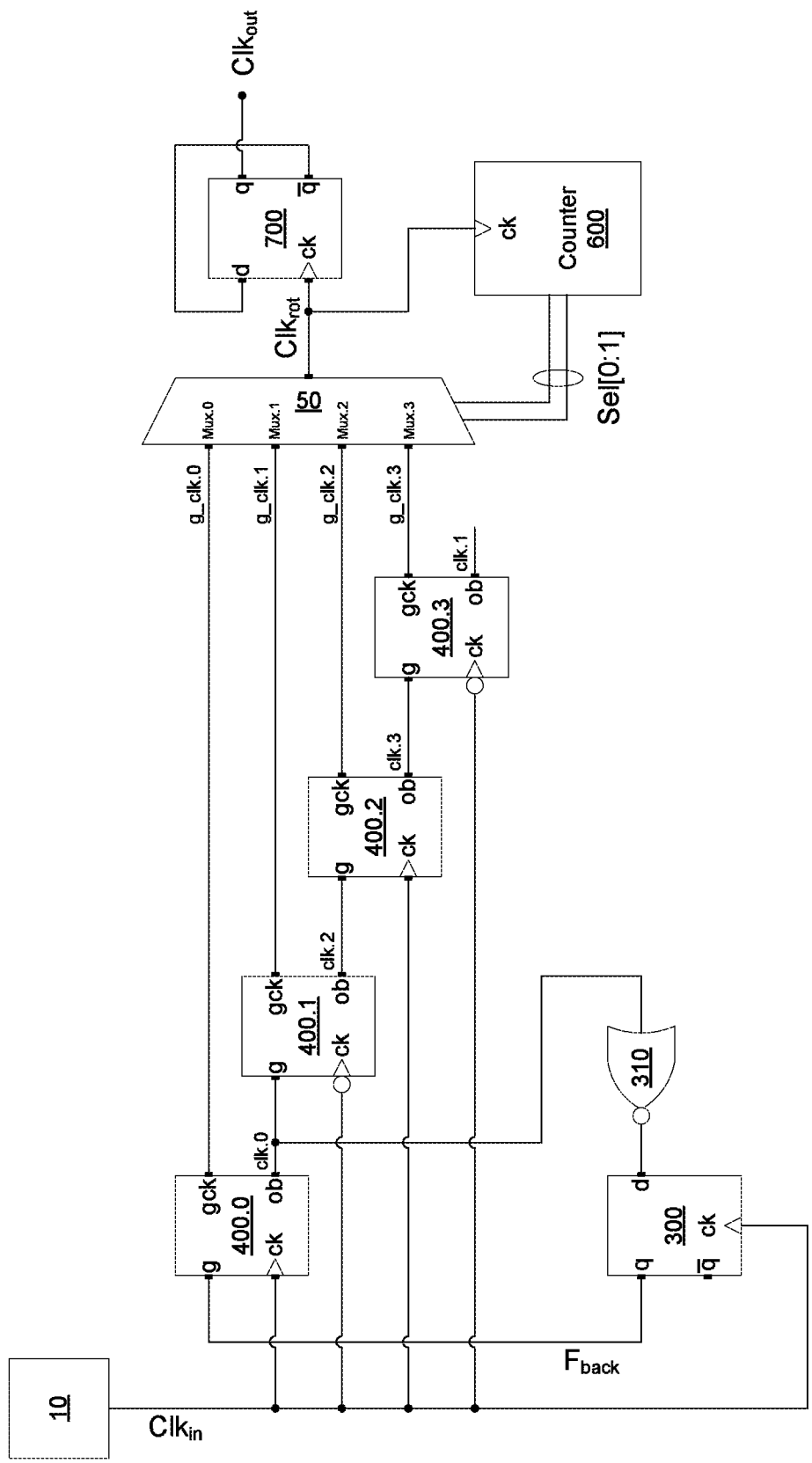
FIG. 3 schematically illustrates a block diagram of a clock signal divider by 3 according to an example of the present invention.

Referring now to FIG. 3, a block diagram of a circuitry of a clock signal divider by 3 according to an example of the present invention is schematically illustrated. The clock signal divider by 3 will be also referred to as "÷3 clock signal divider" in the following.

The embodied ÷3 clock signal divider comprises a clock source 10, which supplies a base clock signal $Clk_{in}$ at a base frequency $f_{in}$. The base clock signal $Clk_{in}$ has a duty cycle of $D_{in}$=50%, wherein duty cycle defines the fraction of one period in which a signal is active:

$$D[\%] = D \cdot 100 = \frac{PW}{T} \cdot 100\%$$

where

D: is the duty cycle ratio or duty cycle factor,

PW: is the pulse width of the base clock signal $Clk_{in}$, and

T: is the total period of the base clock signal $Clk_{in}$.

The clock gating cell register 40 comprises N+1 clock gating cells 400.*i*, wherein i=0, . . . , N; N=(2n+1), n∈ℕ (n=1, 2, . . . ) and wherein N=3 herein defining the divisor of the embodied ÷3 clock signal divider. Each clock gating cell 400.*i* comprises a gate enable input "g" and a clock signal input "ck". Each clock gating cell 400.*i* further comprises gated clock signal output "gck" and an enable signal output "ob". In an embodiment of the present application, each of clock gating cells 400.*i* corresponds to the clock gating cell 100 described above with reference to FIG. 2. The clock signal inputs "ck" of the clock gating cells 400.*i* are connected to the clock source 10 to receive the base clock signal $Clk_{in}$.

Each second clock gating cell 400.*j* (where j=1, 3) is provided with an inverter at the clock signal input "ck", which is configured to invert the base clock signal $Clk_{in}$ supplied thereto before being fed into each respective second clock gating cell 400.*j* (where j=1, 3).

The clock gating cells 400.*i* are connected in series to each other. In particular, the enable signal output "ob" of a clock gating cell 400.*i* is connected to the gate enable input "g" of the next clock gating cell 400.*i*+1. The signal output by a clock gating cell 400.*i* at its enable signal output "ob" will be referred to as cell enable signal clk.i.

The gated clock signal outputs "gck" of the clock gating cells 400.*i* are connected to a multiplexer 50, which is configured to receive four (=N+1) signals and to selectively output one of the received four (=N+1) signals. The signal output by a clock gating cell 400.*i* at its gated clock signal output "gck" will be referred to as gated clock signal g_clk.i.

The shifter logic 30 is arranged to receive the enable signals clk.i of the first N−2 clock gating cells 400.*i* of the clock gating cell register, herein only one clock gating cell. The first clock gating cell is that clock gating cell, which gate enable input "g" is not connected to another clock gating cell according to the serial connection of the clock gating cell 400.*i* described above. Herein, the first clock gating cell is referred to as first clock gating cell 400.0. The shifter logic 30 comprises an NOR gate 310 is arranged to combine the N−2 received enable signals clk.i. This combinatorial NOR logic, of combining within the NOR gate 310 the N−2 received enable signals clk.i, generates a combined enable signal directly from the N−2 received enable signals clk.i. In a further embodiment, the combinatorial logic within the NOR gate 310 is configured to generate the combined enable signal from the N−2 received enable signals clk.i.

The shifter logic 30 is further arranged to receive the base clock signal $CLK_{in}$ from the clock source 10. The shifter logic 30 further comprises a latch 300, such as gated D latch or D flipflop, although other latches are well within the scope of the present invention. The latch 300 allows the combined enable signal to pass through the latch 300 to a feedback signal $F_{back}$ when the latch is enabled (i.e. when the base clock signal $CLK_{in}$ is high), but the latch 300 freezes the combined enable signal at its last output value when the latch 300 is disabled (i.e. when the base clock signal $CLK_{in}$ is low).

The feedback signal $F_{back}$, which is output by the latch 300, is supplied to the gate enable input "g" of the first clock gating cell 400.0.

The multiplexer 50 is provided to output a rotation clock signal $Clk_{rot}$, which is composed from the received N+1 gated clock signal g_clk.i, which are selectively connected through under control of the multiplexer control logic 60, which is configured to generate the multiplexer selecting control signal Sel. The output of the multiplexer 50, at which the rotation clock signal $Clk_{rot}$ is present, is connected to the multiplexer control logic 60 and the output clock generator 70. The multiplexer control logic 60 is arranged to receive the rotation clock signal $Clk_{rot}$ and is configured to generate a current multiplexer selecting control signal Sel in response to a signal edge detected in the rotation clock signal $Clk_{rot}$. The output clock generator 70 is arranged to receive the rotation clock signal $Clk_{rot}$ and is configured to generate the output clock signal $Clk_{out}$ based on the rotation clock signal $Clk_{rot}$.

In an example, the multiplexer control logic 60 is a counter 600 and in particular a Gray code counter 600. In an example, the output clock generator 70 is configured to operate as a clock signal divider, which divides the received rotation clock signal $Clk_{rot}$ by 2. In an example of the present application, the output clock generator 70 comprises a D flipflop 700, which inverted output "q¯" is fed back to the data input "d" of the D flipflop 700. The rotation clock signal $Clk_{rot}$ is supplied to the clock input "ck" of the D flipflop 700. The output clock signal $Clk_{out}$ is generated at the output "q" of the D flipflop 700.

Figure 4:
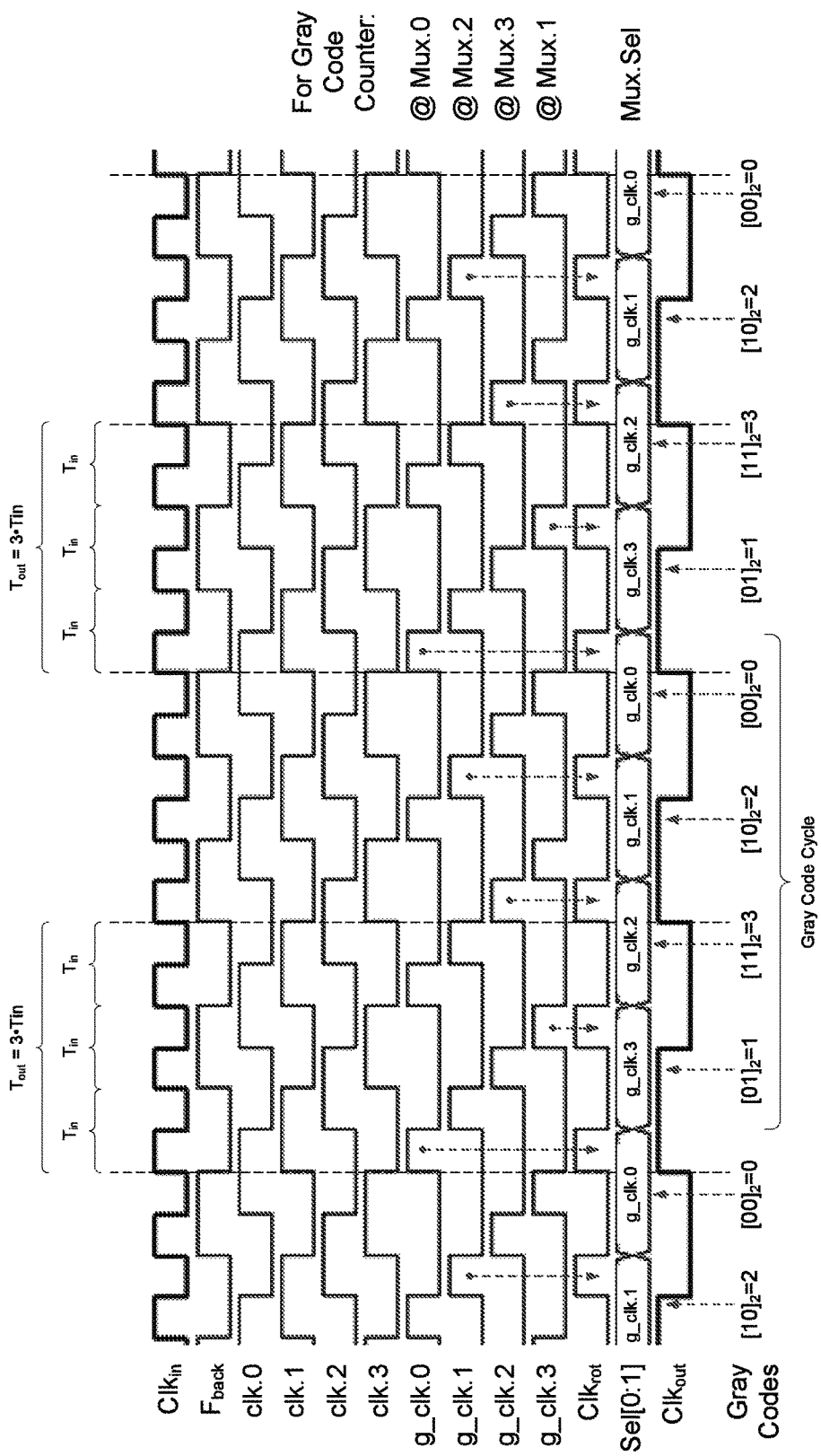
FIG. 4 schematically illustrates a timing diagram of the clock signal divider by 3 according to an example of the present invention.

The properties of the various clock signals as well as the operation of the components of the illustrated ÷3 Clock signal divider will be more fully understood in the following with reference to the exemplary timing diagram illustrated in FIG. 4.

The exemplary timing diagram shown the base clock signal $CLK_{in}$, the feedback signal $F_{back}$, the enable signals clk.i (where i=0, ..., N−1, and N=3), the gated clock signals g_clk.i (where i=0, ..., N−1, and N=3), the rotation clock signal $Clk_{rot}$, the multiplexer selecting control signal Sel, and the output clock signal $Clk_{out}$.

The base clock signal $CLK_{in}$, which is supplied by the clock signal source 10, has a base frequency $f_{in}$, a corresponding period $T_{in}=1/f_{in}$ and a duty cycle factor $D_{in}=½$.

The enable signals clk.i, which are present at the enable signal output "ob" of the respective clock gating cells 400.i and supplied to the respective next clock gating cell 400.i+1, have a frequency $$f_{clk} = 1/2 \cdot f_{in} = \frac{2}{N+1} \cdot f_{in}$$

and a duty cycle factor $$D_{clk} = 1/2 = \frac{2}{N+1}.$$

The cell enable signal clk.i and cell enable signal clk.i+1 of two adjacent clock gating cells 400.i and 400.i+1 are shifted in phase by phase angle $$\Phi_{clk} = 90° = \frac{360°}{N+1},$$

which corresponds to a time shift $\Delta T_{clk}=½\cdot T_{in}$.

The feedback signal $F_{back}$, which is generated by the shifter 30 and supplied to the gate enable input "g" of the first clock gating cell 400.0, has a frequency $f_{back}=f_{clk}$ and a duty cycle factor $D_{back}=D_{clk}$.

The gated clock signals g_clk.i, which are present at the gated clock signal outputs "gck" of the respective clock gating cells 400.i and supplied to respective inputs of the multiplexer 50, have a frequency $$f_{g\_clk} = 1/2 \cdot f_{in} = \frac{2}{N+1} \cdot f_{in}$$

and a duty cycle factor $$D_{g\_clk} = 1/4 = \frac{1}{N+1}.$$

The gated clock signals g_clk.i and gated clock signals g_clk.i+1 of two adjacent clock gating cells 400.i and 400.i+1 are shifted in phase by phase angle $$\Phi_{g\_clk} = 90° = \frac{360°}{N+1},$$

which corresponds to a time shift $\Delta T_{g\_clk}=½\cdot T_{in}$.

The rotation clock signal $Clk_{rot}$, which is generated by the multiplexer 50 from the gated clock signals g_clk.i, has a frequency $$f_{rot} = 2/3 \cdot f_{in} = \frac{2}{N} \cdot f_{in}$$

and a duty cycle factor $$D_{rot} = 1/3 = \frac{1}{N}.$$

The output clock signal $Clk_{out}$, which is generated by the clock generator 70 on the basis of the rotation clock signal $Clk_{rot}$, has a frequency $$f_{g\_clk} = 1/3 \cdot f_{in} = \frac{1}{N} \cdot f_{in}$$

and a duty cycle factor $D_{out}=½$.

The operation of the multiplexer 50 and the multiplexer control logic 60 can be well understood from the exemplified timing diagram. The multiplexer control logic 60 is arranged to control the multiplexer 50 to selectively connect one of the multiplexer inputs, at which the gated clock signals g_clk.i are received, to the multiplexer output. The multiplexer control logic 60 controls the multiplexer 50 to establish a connection between a selected input and the output in response to the detection of an edge present in the rotation clock signal $Clk_{rot}$, i.e. the signal present at the output of the multiplexer 50. On detection of a signal edge such as a falling edge, the multiplexer control logic 60 controls the multiplexer 50 to connect the next input to the output in accordance with a predefined input selection sequence, which is item-wise traversed cyclically. As illustrated in the timing diagram shown in FIG. 4, the predefined input selection sequence Seq may be defined with reference to the received gated clock signals g_clk.i:

Seq={input port of g_clk.3, input port of g_clk.2, input port of g_clk.1, input port of g_clk.0}, where "input port of g_clk.i" designates the input port Mux.i of the multiplexer 50, at which the gated clock signals g_clk.i is received (where i=0, . . . , N; and N=3).

Those skilled in the art understand that the input selection sequence Seq is defined based on the order of the clock gating cells 400.i, namely in reverse order of the above defined serial connection of the clock gating cells 400.i in the clock gating cell register 40, where the clock gating cell 400.0 is the first clock gating cell (i=0) and the clock gating cell 400.3 is the last clock gating cell (i=N=3) of the order of the above defined serial connection.

The operations of the multiplexer control logic 60 and the clock generator 70 are triggered on different edges of the rotation clock signal $Clk_{rot}$. In an example, the operation of the multiplexer control logic 60 is triggered on the falling edge whereas the operation of the clock generator 70 is triggered on the rising edge.

The input ports of the multiplexer 50 may have assigned a number, which when fed by the multiplexer control logic 60 in form of a multiplexer selection signal Sel into the multiplexer 50 controls the multiplexer 50 to selectively connect the input port identified by the multiplexer selection signal Sel to the output of the multiplexer 50. The input selection sequence Seq may have following from:

Seq={3, 2, 1, 0} provided the gated clock signal g_clk.i (i.e. the gated clock signal outputs "gck" of the clock gating cells 400.i) the is connected to the input port i of the multiplexer 50. In an example, the above input selection sequence may be generated by a down counter 600 comprises by the multiplexer control logic 60. The down counter 600 is arranged to start counting with the initial counter value Sel=3 (=N) and decreases by one on edge detection in the rotation clock signal $Clk_{rot}$. The counter 600 is synchronous with the rotation clock signal $Clk_{rot}$. The counter 600 is operated cyclic or in round robin manner, which means that once the counter value Sel has reached the lowest value Sel=0, the next counter value is the initial counter value Sel=3.

In a further example of the present application, the input selection sequence Seq may be defined based on Gray codes, such as Seq={1, 3, 2, 0}={$01_2$, $11_2$, $10_2$, $00_2$}

Figure 9C:
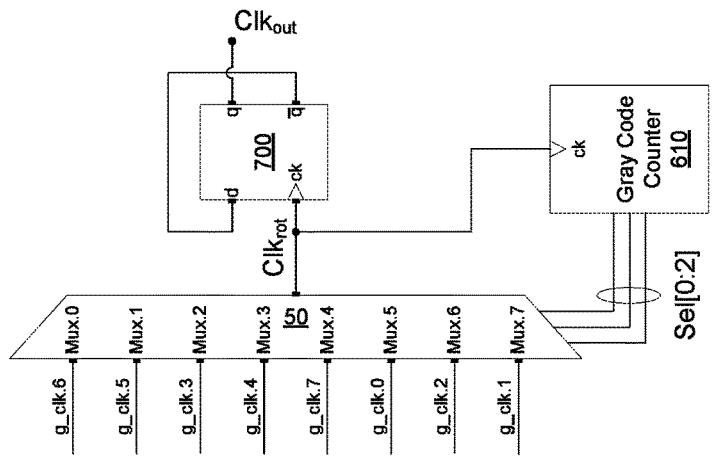
FIGS. 9a to 9c schematically illustrates block diagrams of Gray code counters generating multiplexer selection signals for the above exemplified clock signal dividers according to further examples of the present invention.
Figure 9B:
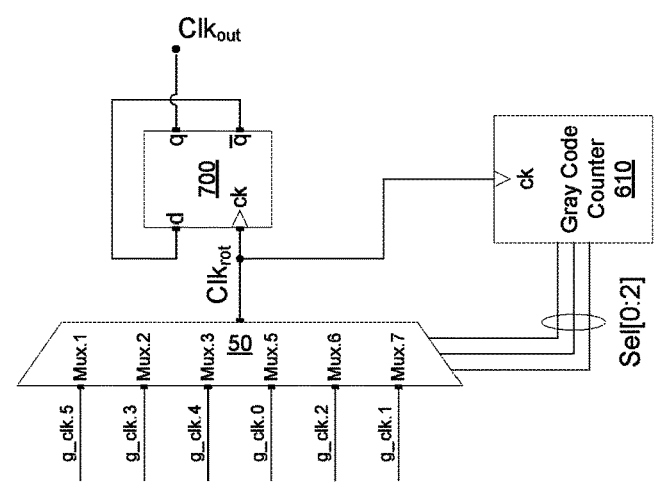
Figure 9A:
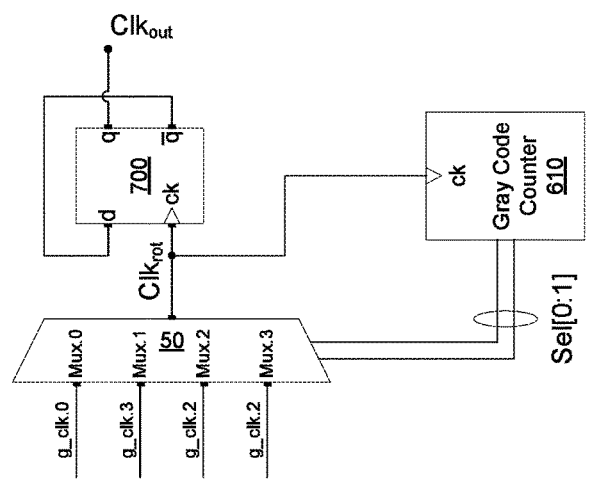

The gated clock signals g_clk.i (in inverse order of the clock gating cells 400.i generating the respective gated clock signals g_clk.i) are connected to the input ports of the multiplexer 50 in accordance with the above defined sequences of Gray codes. For instance, the gated clock signal g_clk.3 is connected to the input port 1 ($01_2$), the gated clock signal g_clk.2 is connected to the input port 3 ($11_2$), the gated clock signal g_clk.1 is connected to the input port 2 ($10_2$) and the gated clock signal g_clk.0 is connected to the input port 0 ($00_2$). The input port k of the multiplexer 50 is also referred to as Mux.k, where k=0, . . . , N (with N=3). A corresponding embodiment of the interconnection of the gated clock signals g_clk.i and the multiplexer 50 is also shown in FIG. 9a. the multiplexer control logic 60, which comprises a Gray code counter 610, is configured to cycle repeatedly through the Gray code sequence, code-wise on detection of a signal edge (e.g. a falling edge) in the rotation clock signal $Clk_{rot}$. The current Gray code is supplied by the multiplexer control logic 60 as multiplexer selection signal Sel to the multiplexer 50, which in response to a received as multiplexer selection signal Sel comprising a current Gray code switchable connects the corresponding input port to the output of the multiplexer 50. For the sake of illustration, FIG. 9a depicts a state diagram of the above described Gray code counter loop.

Figure 5:
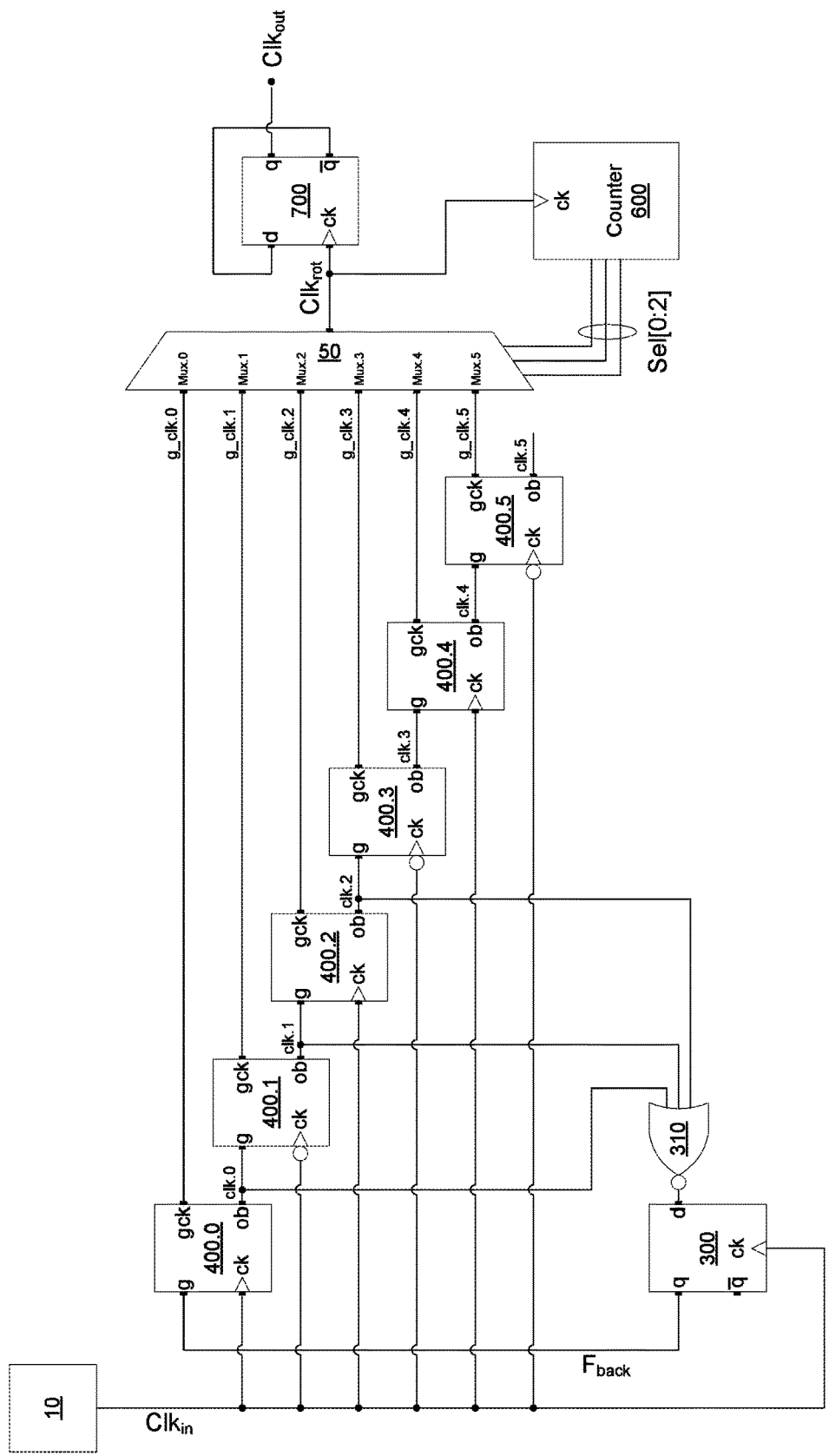
FIG. 5 schematically illustrates a block diagram of a clock signal divider by 5 according to an example of the present invention.

Referring now to FIG. 5, a block diagram of a circuitry of a clock signal divider by 5 according to an example of the present invention is schematically illustrated. The clock signal divider by 5 will be also referred to as "÷5 clock signal divider" in the following. The following description is focused on components, which are different and/or required in addition to those already explained above with reference to the embodied ÷3 clock signal divider in order to omit unnecessary repetitions. Hence, the above description applies analogously to the ÷5 clock signal divider embodied and described in the following. Those skilled in the art will be enabled by the following description to transfer the above teaching relating to the ÷3 clock signal divider accordingly.

The clock gating cell register 40 comprises N+1=6 clock gating cells 400.i, wherein i=0, . . . , N and N=5 herein, defining the divisor of the embodied ÷5 clock signal divider. In an embodiment of the present application, each of clock gating cells 400.i corresponds to the clock gating cell 100 described above with reference to FIG. 2. The clock signal inputs "ck" of the clock gating cells 400.i are connected to the clock source 10 to receive the base clock signal $Clk_{in}$.

Each second clock gating cell 400.j (where j=1, 3, 5) is provided with an inverter at the clock signal input "ck", which is configured to invert the base clock signal $Clk_{in}$ supplied thereto before being fed into each respective second clock gating cell 400.j (where j=1, 3, 5).

The clock gating cells 400.i are connected in series to each other. In particular, the enable signal output "ob" of a clock gating cell 400.i is connected to the gate enable input "g" of the next clock gating cell 400.i+1. The signal output by a clock gating cell 400.i at its enable signal output "ob" will be referred to as cell enable signal clk.i.

The gated clock signal outputs "gck" of the clock gating cells 400.i are connected to a multiplexer 50, which is configured to receive six (=N+1) signals and to selectively output one of the received six (=N+1) signals. The signal output by a clock gating cell 400.i at its gated clock signal output "gck" will be referred to as gated clock signal g_clk.i.

The shifter logic 30 is arranged to receive the enable signals clk.i of the first N−2 clock gating cells 400.i of the clock gating cell register, herein the three clock gating cells 400.0, 400.1 and 400.2. The shifter logic 30 comprises an NOR gate 310 is arranged to combine the three (=N−2) received enable signals clk.0, clk.1 and clk.2 and to generate a combined enable signal thereof.

The latch 300 of the shifter logic 30 allows the combined enable signal to pass through the latch 300 to a feedback signal $F_{back}$ when the latch is enabled (i.e. when the base clock signal $CLK_{in}$ is high), but the latch 300 freezes the combined enable signal at its last output value when the latch 300 is disabled (i.e. when the base clock signal $CLK_{in}$ is low). The feedback signal $F_{back}$, which is output by the latch 300, is supplied to the gate enable input "g" of the first clock gating cell 400.0.

Figure 6:
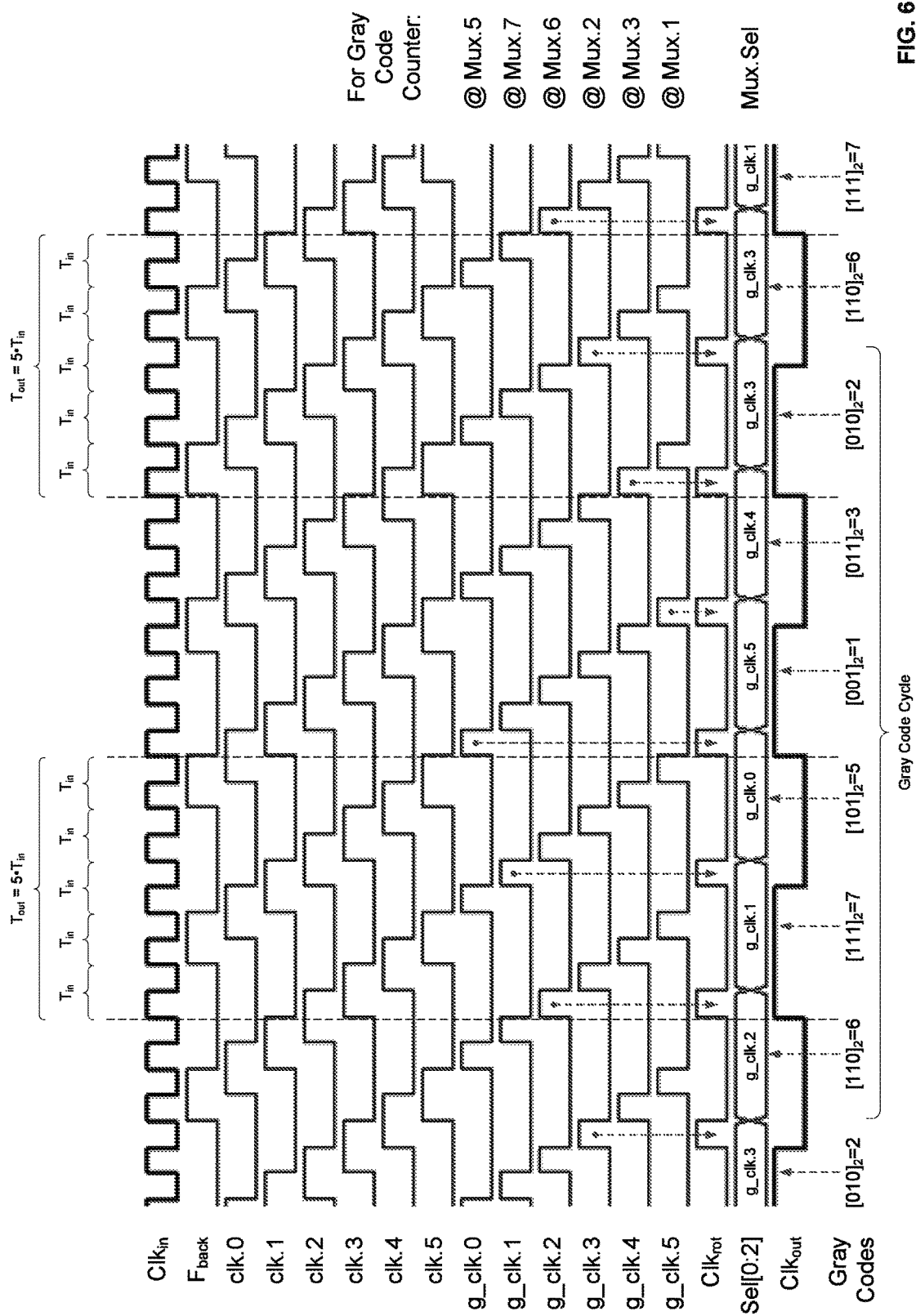
FIG. 6 schematically illustrates a timing diagram of the clock signal divider by 5 according to an example of the present invention.

The properties of the various clock signals as well as the operation of the components of the illustrated ÷5 Clock signal divider will be more fully understood in the following with reference to the exemplary timing diagram illustrated in FIG. 6.

The exemplary timing diagram shown the base clock signal $CLK_{in}$, the feedback signal $F_{back}$, the enable signals clk.i (where i=0, . . . , N−1, and N=5), the gated clock signals g_clk.i (where i=0, . . . , N−1, and N=5), the rotation clock signal $Clk_{rot}$, the multiplexer selecting control signal Sel, and the output clock signal $Clk_{out}$.

The base clock signal $CLK_{in}$, which is supplied by the clock signal source 10, has a base frequency $f_{in}$, a corresponding $T_{in}=1/f_{in}$ and a duty cycle factor $D_{in}=\frac{1}{2}$.

The enable signals clk.i, which are present at the enable signal output "ob" of the respective clock gating cells 400.i and supplied to the respective next clock gating cell 400.i+1, have a frequency $$f_{clk} = 1/3 \cdot f_{in} = \frac{2}{N+1} \cdot f_{in}$$

and a duty cycle factor $$D_{clk} = 1/3 = \frac{2}{N+1}.$$

The cell enable signal clk.i and cell enable signal clk.i+1 of two adjacent clock gating cells 400.i and 400.i+1 are shifted in phase by phase angle $$\Phi_{clk} = 60° = \frac{360°}{N+1},$$

which corresponds to a time shift $\Delta T_{clk}=\frac{1}{2} \cdot T_{in}$.

The feedback signal $F_{back}$, which is generated by the shifter 30 and supplied to the gate enable input "g" of the first clock gating cell 400.0 has a frequency $f_{back}=f_{clk}$ and a duty factor $D_{back}=D_{clk}$.

The gated clock signals g_clk.i, which are present at the gated clock signal outputs "gck" of the respective clock gating cells 400.i and supplied to respective inputs of the multiplexer 50, have a frequency $$f_{g\_clk} = 1/3 \cdot f_{in} = \frac{2}{N+1} \cdot f_{in}$$

and a duty cycle factor $$D_{g\_clk} = 1/6 = \frac{1}{N+1}.$$

The gated clock signals g_clk.i and gated clock signals g_clk.i+1 of two adjacent clock gating cells 400.i and 400.i+1 are shifted in phase by phase angle $$\Phi_{g\_clk} = 60° = \frac{360°}{N+1},$$

which corresponds to a time shift $\Delta T_{g\_clk}=\frac{1}{2} \cdot T_{in}$.

The rotation clock signal $Clk_{rot}$, which is generated by the multiplexer 50 from the gated clock signals g_clk.i, has a frequency $$f_{rot} = 2/5 \cdot f_{in} = \frac{2}{N} \cdot f_{in}$$

and a duty cycle factor $$D_{rot} = 1/5 = \frac{1}{N}.$$

The output clock signal $Clk_{out}$, which is generated by the clock generator 70 on the basis of the rotation clock signal $Clk_{rot}$, has a frequency $$f_{g\_clk} = 1/5 \cdot f_{in} = \frac{1}{N} \cdot f_{in}$$

and a duty cycle factor $D_{out}=\frac{1}{2}$.

The operation of the multiplexer 50 and the multiplexer control logic 60 can be well understood from the exemplified timing diagram. As illustrated in the timing diagram shown in FIG. 6, the predefined input selection sequence Seq for the control of the selective switching of the multiplexer 50 may be defined with reference to the received gated clock signals g_clk.i:

Seq={input port of g_clk.5, input port of g_clk.4, input port of g_clk.3, input port of g_clk.2, input port of g_clk.1, input port of g_clk.0}, where "input port of g_clk.i" designates the input port of the multiplexer 50, at which the gated clock signals g_clk.i is received (where i=0, . . . , N; and N=5).

Those skilled in the art understand that the input selection sequence Seq is defined based on the order of the clock gating cells 400.i, namely in inverse order of the above defined serial connection of the clock gating cells 400.i in the clock gating cell register 40, where the clock gating cell 400.0 is the first clock gating cell (i=0) and the clock gating cell 400.5 is the last clock gating cell (i=N=5) of the order of the above defined serial connection.

The input ports of the multiplexer 50 may have assigned a number, which when fed by the multiplexer control logic 60 in form of a multiplexer selection signal Sel into the multiplexer 50 controls the multiplexer 50 to selectively connect the input port identified by the multiplexer selection signal Sel to the output of the multiplexer 50. The input selection sequence Seq may have following from:

Seq={5, 4, 3, 2, 1, 0} provided the gated clock signal g_clk.i (i.e. the gated clock signal outputs "gck" of the clock gating cells 400.i) is connected to the input port Mux.i of the multiplexer 50. In an example, the above input selection sequence may be generated by a rotation clock signal $Clk_{rot}$ synchronous, cyclic down counter 600 comprises by the multiplexer control logic 60. The down counter 600 is arranged to start counting with the initial counter value Sel=5 (=N) and decreases by one on edge detection in the rotation clock signal $Clk_{rot}$. The down counter is operated cyclic or in round robin manner, which means that once the counter value Sel has reached the lowest value Sel=0, the next counter value is the initial counter value Sel=5.

In a further example of the present application, the input selection sequence Seq may be defined based on Gray codes, such as Seq={1, 3, 2, 6, 7, 5}={$001_2$, $011_2$, $010_2$, $110_2$, $101_2$}

The gated clock signals g_clk.i (in inverse order of the clock gating cells 400.i generating the respective gated clock signals g_clk.i) are connected to the input ports Mux.i of the multiplexer 50 in accordance with the above defined sequences of Gray codes. For instance, the gated clock signal g_clk.5 is connected to the input port Mux.1 ($001_2$), the gated clock signal g_clk. 4 is connected to the input port Mux.3 ($011_2$), the gated clock signal g_clk.3 is connected to the input port Mux.2 ($010_2$), the gated clock signal g_clk.2 is connected to the input port Mux.6 ($110_2$), the gated clock signal g_clk.1 is connected to the input port Mux.7 ($111_2$), and the gated clock signal g_clk.0 is connected to the input port Mux.5 ($101_2$).

The input port k of the multiplexer 50 is also referred to as Mux.k, where k=0, . . . , (with N=5). A corresponding embodiment of the interconnection of the gated clock signals g_clk.i and the multiplexer 50 is also shown in FIG. 9b. The multiplexer control logic 60, which comprises a Gray code counter 610, is configured to cycle repeatedly through the Gray code sequence, code-wise on detection of a signal edge (e.g. a falling edge) in the rotation clock signal $Clk_{rot}$. For the sake of illustration, FIG. 9b depicts a state diagram of the above described Gray code counter loop. It should be noted that the states $100_2$=4 and $000_2$=0 of the Gray code counter 610 are unused states, which are default affected. The Gray code counter 610 assuming one of the unused states returns to the regular loop as exemplified in FIG. 9b.

Figure 7:
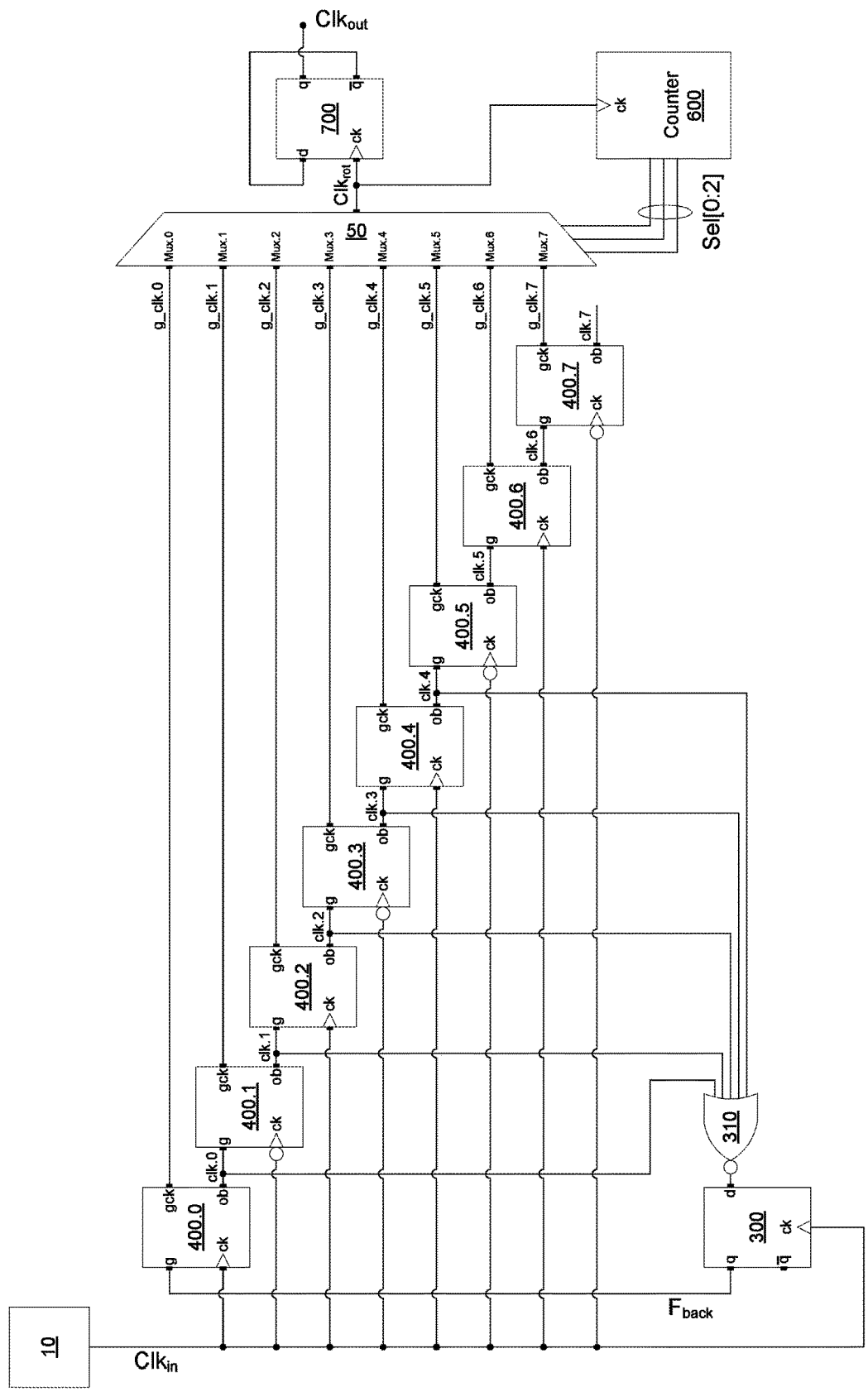
FIG. 7 schematically illustrates a block diagram of a clock signal divider by 7 according to an example of the present invention.

Referring now to FIG. 7, a block diagram of a circuitry of a clock signal divider by 7 according to an example of the present invention is schematically illustrated. The clock signal divider by 7 will be also referred to as "÷7 clock signal divider" in the following. The following description is focused on components, which are different and/or required in addition to those already explained above with reference to the embodied ÷3 clock signal divider and the embodied ÷5 clock signal divider in order to omit unnecessary repetitions. Hence, the above description applies analogously to the ÷7 clock signal divider embodied and described in the following. Those skilled in the art will be enabled by the following description to transfer the above teaching relating to the ÷3 clock signal divider and the ÷5 clock signal divider accordingly.

The clock gating cell register 40 comprises N+1=8 clock gating cells 400.i, wherein i=0, . . . , N and N=7 herein, defining the divisor of the embodied ÷7 clock signal divider. In an embodiment of the present application, each of clock gating cells 400.i corresponds to the clock gating cell 100 described above with reference to FIG. 2. The clock signal inputs "ck" of the clock gating cells 400.i are connected to the clock source 10 to receive the base clock signal $Clk_{in}$.

Each second clock gating cell 400.j (where j=1, 3, 5, 7) is provided with an inverter at the clock signal input "ck", which is configured to invert the base clock signal $Clk_{in}$ supplied thereto before being fed into each respective second clock gating cell 400.j (where j=1, 3, 5, 7).

The clock gating cells 400.i are connected in series to each other. In particular, the enable signal output "ob" of a clock gating cell 400.i is connected to the gate enable input "g" of the next clock gating cell 400.i+1. The signal output by a clock gating cell 400.i at its enable signal output "ob" will be referred to as cell enable signal clk.i.

The gated clock signal outputs "gck" of the clock gating cells 400.i are connected to a multiplexer 50, which is configured to receive eight (=N+1) signals and to selectively output one of the received eight (=N+1) signals. The signal output by a clock gating cell 400.i at its gated clock signal output "gck" will be referred to as gated clock signal g_clk.i.

The shifter logic 30 is arranged to receive the enable signals clk.i of the first N−2 clock gating cells 400.i of the clock gating cell register, herein the five clock gating cells 400.0, 400.1, 400.2, 400.3, and 400.4. The shifter logic 30 comprises an NOR gate 310 is arranged to combine the five (=N−2) received enable signals clk.0, clk.1, clk.2, clk.3, and clk.4 and to generate a combined enable signal thereof.

The latch 300 of the shifter logic 30 allows the combined enable signal to pass through the latch 300 to a feedback signal $F_{back}$ when the latch is enabled (i.e. when the base clock signal $CLK_{in}$ is high), but the latch 300 freezes the combined enable signal at its last output value when the latch 300 is disabled (i.e. when the base clock signal $CLK_{in}$ is low). The feedback signal $F_{back}$, which is output by the latch 300, is supplied to the gate enable input "g" of the first clock gating cell 400.0.

Figure 8:
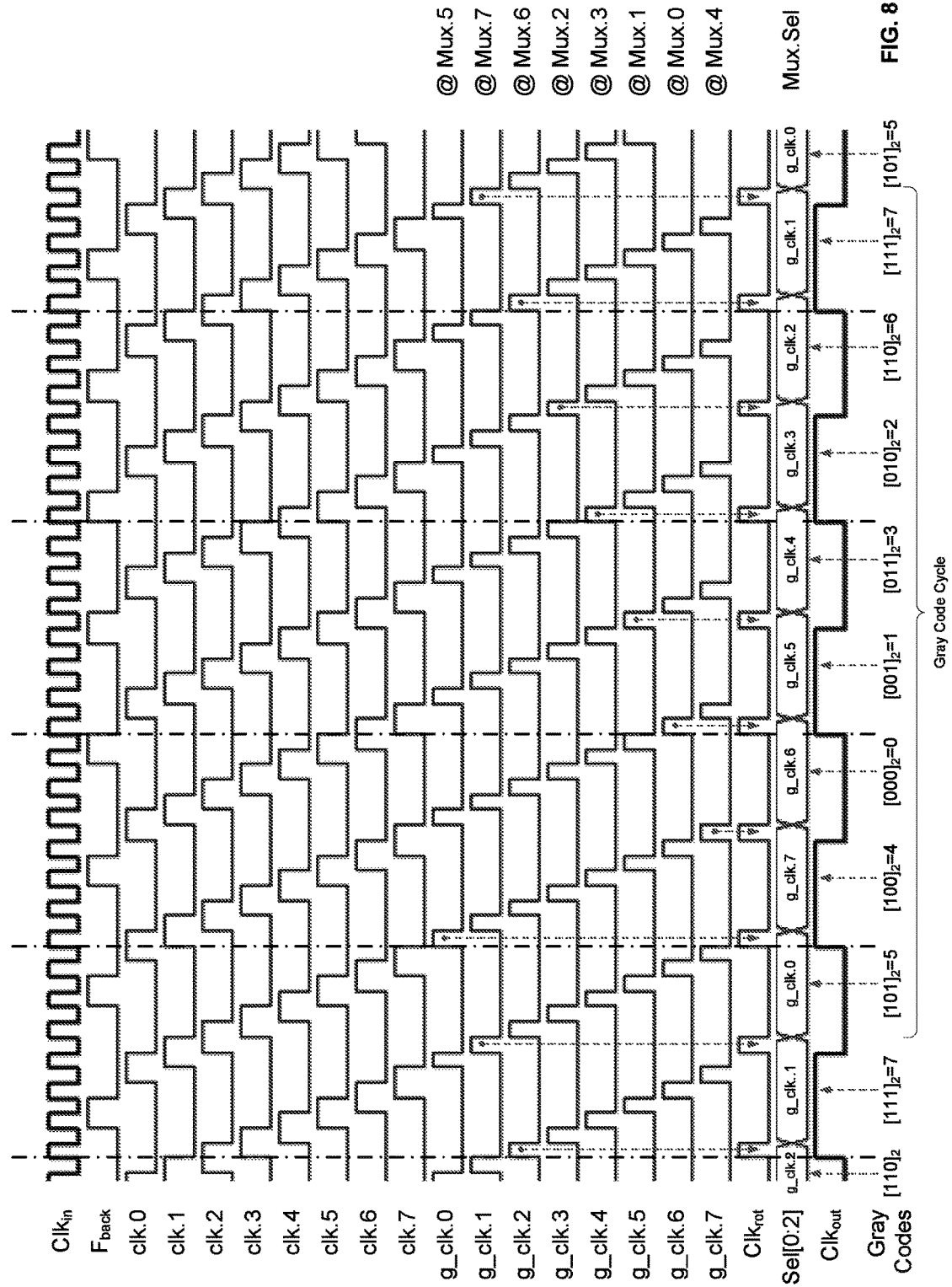
FIG. 8 schematically illustrates a timing diagram of the clock signal divider by 7 according to an example of the present invention.

The properties of the various clock signals as well as the operation of the components of the illustrated ÷7 Clock signal divider will be more fully understood in the following with reference to the exemplary timing diagram illustrated in FIG. 8.

The exemplary timing diagram shown the base clock signal $CLK_{in}$, the feedback signal $F_{back}$, the enable signals clk.i (where i=0, . . . , N−1, and N=7), the gated clock signals g_clk.i (where i=0, . . . , N−1, and N=7), the rotation clock signal $Clk_{rot}$, the multiplexer selecting control signal Sel, and the output clock signal $Clk_{out}$.

The base clock signal $CLK_{in}$, which is supplied by the clock signal source 10, has a base frequency $f_{in}$, a corresponding period $T_{in}=1/f_{in}$ and a duty cycle factor $D_{in}$½.

The enable signals clk.i, which are present at the enable signal output "ob" of the respective clock gating cells 400.i and supplied to the respective next clock gating cell 400.i+1, have a frequency $$f_{clk} = 1/4 \cdot f_{in} = \frac{2}{N+1} \cdot f_{in}$$

and a duty cycle factor $$D_{clk} = 1/4 = \frac{2}{N+1}.$$

The cell enable signal clk.i and cell enable signal clk.i+1 of two adjacent clock gating cells 400.i and 400.i+1 are shifted in phase by phase angle $$\Phi_{clk} = 45° = \frac{360°}{N+1},$$

which corresponds to a time shaft $\Delta T_{clk}=½\cdot T_{in}$.

The feedback signal $F_{back}$, which is generated by the shifter 30 and supplied to the gate enable input "g" of the first clock gating cell 400.0, has a frequency $f_{back}=f_{clk}$ and a duty cycle factor $D_{back}=D_{clk}$.

The gated clock signals g_clk.i, which are present at the gated clock signal outputs "gck" of the respective clock gating cells 400.*i* and supplied to respective inputs of the multiplexer 50, have a frequency $$f_{g\_clk} = 1/4 \cdot f_{in} = \frac{2}{N+1} \cdot f_{in}$$

and a duty cycle factor $$D_{g\_clk} = 1/8 = \frac{1}{N+1}.$$

The gated clock signals g_clk.i+1 of two adjacent clock gating cells 400.*i* and 400.*i*+1 are shifted in phase by phase angle $$\Phi_{g\_clk} = 45° = \frac{360°}{N+1},$$

which corresponds to a time shift $\Delta T_{g\_clk} = \frac{1}{2} \cdot T_{in}$.

The rotation clock signal $Clk_{rot}$, which is generated by the multiplexer 50 from the gated clock signals g_clk.i, has a frequency $$f_{rot} = 2/7 \cdot f_{in} = \frac{2}{N} \cdot f_{in}$$

and a duty cycle factor $$D_{rot} = 1/7 = \frac{1}{N}.$$

The output clock signal $Clk_{out}$, which is generated by the clock generator 70 on the basis of the rotation clock signal $Clk_{rot}$, has a frequency $$f_{g\_clk} = 1/7 \cdot f_{in} = \frac{1}{N} \cdot f_{in}$$

and a duty cycle factor $D_{out} = \frac{1}{2}$.

The operation of the multiplexer 50 and the multiplexer control logic 60 can be well understood from the exemplified timing diagram. As illustrated in the timing diagram shown in FIG. 8, the predefined input selection sequence Seq for the control of the selective switching of the multiplexer 50 may be defined with reference to the received gated clock signals g_clk.i:

Seq={input port of g_clk.7, input port of g_clk.6, input port of g_clk.5, input port of g_clk.4, input port of g_clk.3, input port of g_clk.2, input port of g_clk.1, input port of g_clk.0}, where "input port of g_clk.i" designates the input port of the multiplexer 50, at which the gated clock signals g_clk.i is received (where i=0, N; and N=7).

Those skilled in the art understand that the input selection sequence Seq is defined based on the order of the clock gating cells 400.*i*, namely in inverse order of the above defined serial connection of the clock gating cells 400.*i* in the clock gating cell register 40, where the clock gating cell 400.0 is the first clock gating cell (i=0) and the clock gating cell 400.7 is the last clock gating cell (i=N=7) of the order of the above defined serial connection.

The input ports of the multiplexer 50 may have assigned a number, which when fed by the multiplexer control logic 60 in form of a multiplexer selection signal Sel into the multiplexer 50 controls the multiplexer 50 to selectively connect the input port identified by the multiplexer selection signal Sel to the output of the multiplexer 50. The input selection sequence Seq may have following from:

Seq={7, 6, 5, 4, 3, 2, 1, 0} provided the gated clock signal g_clk.i (i.e. the gated clock signal outputs "gck" of the clock gating cells 400.*i*) is connected to the input port Mux.i of the multiplexer 50. In an example, the above input selection sequence may be generated by a rotation clock signal $Clk_{rot}$ synchronous, cyclic down counter 600 comprises by the multiplexer control logic 60. The down counter 600 is arranged to start counting with the initial counter value Sel=7 (=N) and decreases by one on edge detection in the rotation clock signal $Clk_{rot}$. The down counter is operated cyclic or in round robin manner, which means that once the counter value Sel has reached the lowest value Sel=0, the next counter value is the initial counter value Sel=7.

In a further example of the present application, the input selection sequence Seq may be defined based on Gray codes, such as Seq={4, 0, 1, 3, 2, 6, 7, 5}={$001_2$, $011_2$, $010_2$, $110_2$, $111_2$, $101_2$}

The gated clock signals g_clk.i (in inverse order of the clock gating cells 400.*i* generating the respective gated clock signals g_clk.i) are connected to the input ports Mux.i of the multiplexer 50 in accordance with the above defined sequences of Gray codes. For instance, the gated clock signal g_clk.7 is connected to the input port Mux.4 ($100_2$), the gated clock signal g_clk.6 is connected to the input port Mux.0 ($000_2$), the gated clock signal g_clk.5 is connected to the input port Mux.1 ($001_2$), the gated clock signal g_clk.4 is connected to the input port Mux.3 ($011_2$), the gated clock signal g_clk.3 is connected to the input port Mux.2 ($010_2$), the gated clock signal g_clk.2 is connected to the input port 6 ($110_2$), the gated clock signal g_clk.1 is connected to the input port Mux.7 ($111_2$), and the gated clock signal g_clk.0 is connected to the input port Mux.5 ($101_2$).

The input port k of the multiplexer 50 is also referred to as Mux.k, where j=0, N (with N=5). A corresponding embodiment of the interconnection of the gated clock signals g_clk.i and the multiplexer 50 is also shown in FIG. 9*c*. The multiplexer control logic 60, which comprises a Gray code counter 610, is configured to cycle repeatedly through the Gray code sequence, code-wise on detection of a signal edge (e.g. a falling edge) in the rotation clock signal $Clk_{rot}$.

Figure 10A:
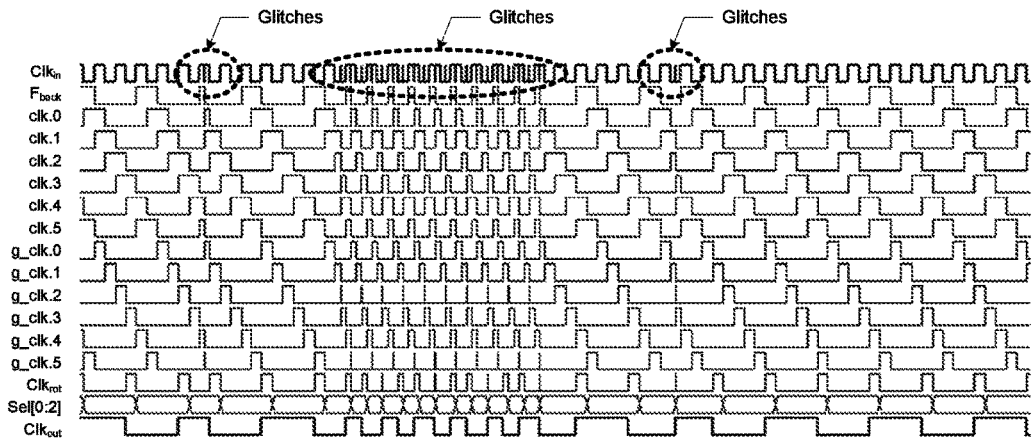
FIGS. 10a to 10c schematically illustrates timing diagrams of a clock signal divider by 5 with injected faults according to an example of the present invention.
Figure 10B:
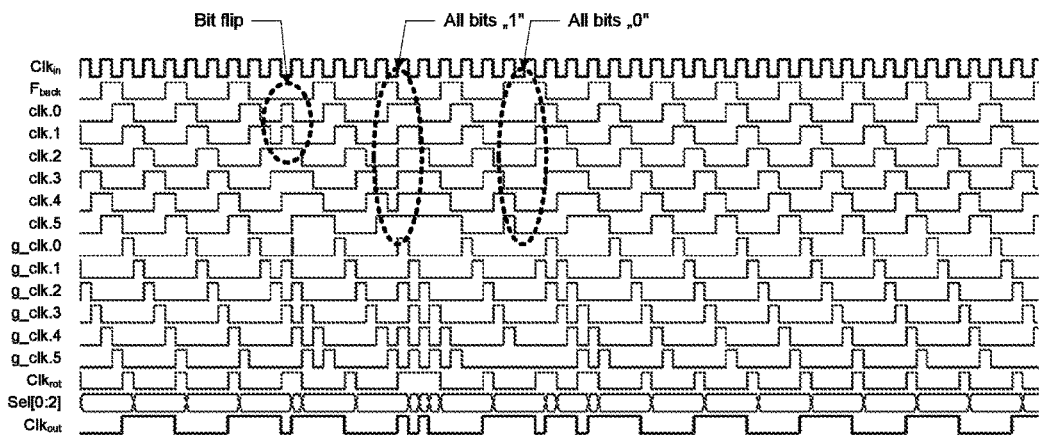
Figure 10C:
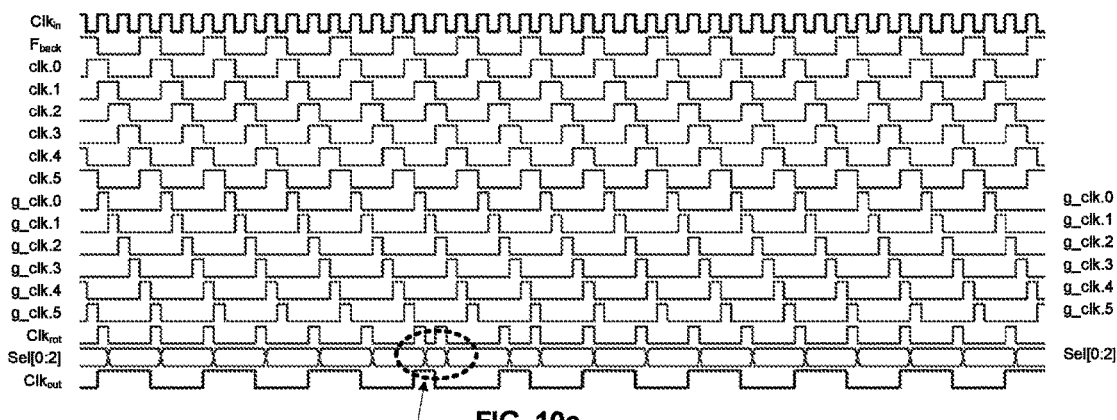

The robustness of the above described and exemplified clock gating cell based feedback shift register 20 is illustrated with respect to the timing diagrams schematically illustrated in FIGS. 10*a* to 10*c*. The timing diagrams schematically illustrated in FIGS. 10*a* to 10*c* are based on the above described ÷5 clock signal divider. Different faults are injected into signals of the embodied ÷5 clock signal divider and the response thereto are illustrated. For instance, the various signals within the clock signal dividers by odd integer as described herein may be subjected to EMC perturbations.

Referring now to FIG. 10*a*, glitches occurring in the base clock signal $Clk_{in}$ and the responses of the various signals thereto are shown. Glitches in the base clock signal $Clk_{in}$ may have various different sources; EMC perturbations is one source of clock glitches. As immediately understood by those skilled in the art, the various signals of the embodied ÷5 clock signal divider get disturbed by the glitches in the base clock signal Clk$_{in}$, but the embodied ÷5 clock signal divider recovers to proper signal timing without need of intervention. The self-recovery in response to one or more glitches applies in general to clock signal divider by odd integer according to the suggested design of the present application.

Referring now to FIG. 10b, faults may also occur in signals of the clock gating cell register. Exemplarily, bit flip in one or more enable signals clk.i and the responses of the various signals thereto are shown. As again immediately understood by those skilled in the art, the various signals of the embodied ÷5 clock signal divider get disturbed by bit flip in in one or more enable signals clk.i but likewise the embodied ÷5 clock signal divider recovers to proper signal timing without need of intervention. The self-recovery in response to bit flip applies in general to clock signal divider by odd integer according to the suggested design of the present application.

Referring now to FIG. 10c, faults may further occur in the multiplexer selection signal Sel. For example, the multiplexer selection signal Sel may assume an unused value due to bit flip. As exemplarily shown in FIG. 10c, the multiplexer selection signal Sel may assume the value 4 ($=100_2$), which is an unused state of the Gray code counter 610 as shown in FIG. 9b. If one or more states of a Gray code counter 610 are unused, as being the case for the Gray code counter 610 of the embodied ÷5 clock signal divider, the unused states are default affected. In response to the Gray code counter 610 assuming, the Gray code counter 610 returns to a used state of the regular loop. As demonstrated in FIG. 10c, the recovers to proper signal timing without need of intervention.

Examples of a circuit of a frequency divider, which is arranged to divide the frequency of an input clock signal by odd integer N have been exemplified above. The frequency divider circuit comprises a shift register including a number of N+1 clock gating cells and a shift logic. The clock gating cells are connected in series to each other. Each clock gating cell has a gate enable input "g", a clock signal input "ck", a gated clock signal output "gck" and an enable signal output "ob". The input clock signal is fed into the clock signal input "ck" of each clock gating cell. The shift logic is configured to receive enable signals from a set of number of N+1 clock gating cells and to generate a feedback signal. The generated feedback signal is supplied to the gate enable input of the first one of the number of N+1 clock gating cells. The frequency divider circuit further comprises a multiplexer, which is configured to receive at input ports the N+1 gated clock signals and to output a rotation clock signal with a frequency of 2/N of the frequency of the input clock signal. The frequency divider circuit further comprises a frequency generator configured to receive the rotation clock signal and to generate an output clock signal with a frequency of 1/N and a duty cycle of 50%.

Due to the serial interconnection of the clock gating cells in the linear register, a single high state is cyclically shifted through the linear register, which means that only one of the high signal is present in the gated clock signals generated by the number of N+1 clock gating cells at the same time. The clock gating cells further isolate the (high and/or low) pluses of the input clock signal in that each generated gated clock signal has a frequency of $$\frac{2}{N+1}$$

of the frequency of the input clock signal. The interleaved raising and falling edges protects the circuit of a frequency divider against delays, which may occur in the clock tree. Consequently, the suggested circuit of a frequency divider is robust against signal disturbances in particular bit flips.

In an example, a gate enable input of each one of the number of N+1 clock gating cells is connected to an enable signal output of the directly preceding one of the number of N+1 clock gating cells. A respective enable signal is fed from the enable signal output of each clock gating cell to the gate enable input of the directly preceding clock gating cell.

In an example, a multiplexer control logic configured to receive the rotation clock signal and to control a selective connection of one of the input ports to the output of the multiplexer based on the rotation clock signal.

In an example, the shift logic comprises an NOR gate configured to receive the enable signals and to logically combine the received enable signals to generate a combined enable signal; and a gated latch configured to receive the combined enable signal at a data input and to receive the input clock signal at a clock signal input and to output the feedback signal at an output.

In an example, the set of the number of N+1 clock gating cells comprises N−3 clock gating cells first in sequence of the number of N+1 clock gating cells.

In an example, the multiplexer control logic comprises a counter configured to detect an edge in the rotation clock signal and to cyclically count in response to an edge detection. A counter value is supplied to the multiplexer as multiplexer selecting control signal, in response to which the multiplexer selectively connects a respective input port to the output.

In an example, the counter is a cyclic counter. In an example, the counter is a Gray code counter. In an example, the counter is arranged to detect a falling edge of the rotation clock signal.

In an example, the multiplexer control logic is arranged to control the multiplexer to cyclically connect the N+1 gated clock signals in reverse order according to the serial connection of the clock gating cells to the output.

In an example, the frequency generator comprises a gated latch clocked by the rotation clock signal and having a feedback path connecting on inverted output to a data input. The output clock signal is present at an output of the gated latch.

In an example, the gated clock signals have a frequency of $$\frac{2}{N+1}$$

of the frequency of the input clock signal and a duty cycle factor $$\frac{1}{N+1}.$$

The enable signals have a frequency of $$\frac{2}{N+1}$$

of the frequency of the input clock signal and a duty cycle factor $$\frac{2}{N+1}.$$

In an example, the input clock signal has a duty cycle of 50%.

Examples of operating a circuit of a frequency divider, which is provided to divide the frequency of an input clock signal by odd integer N have been exemplified above. An input clock signal is fed into clock signal inputs of each one of a number of N+1 clock gating cells. The N+1 clock gating cells are connected in series to each other in a shift register further comprising a shift logic. Enable signals are received at the shift logic from a set of the number of N+1 clock gating cells generating a feedback signal. The feedback signal is supplied by the shift logic to a gate enable input of the first one of the number of N+1 clock gating cells. N+1 gated clock signals are received at a multiplexer from the number of N+1 clock gating cells. A rotation clock signal is output by the at a multiplexer. The rotation clock signal has a frequency of 2/N of the frequency of the input clock signal. The rotation clock signal is received at a frequency generator. An output clock signal with a frequency of 1/N is generated at the frequency generator.

In an example, the rotation clock signal is received at a multiplexer control logic and a selective connection of one of the input ports to the output of the multiplexer is controlled by the multiplexer control logic based on the rotation clock signal.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To illustrate clearly this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

The invention claimed is:

1. A circuit of a frequency divider arranged to divide a frequency of an input clock signal by odd integer N, comprising:
    a shift register comprising a number of N+1 clock gating cells being connected in series to each other and a shift logic,
    wherein an input clock signal is fed into clock signal inputs of each one of the number of N+1 clock gating cells,
    wherein the shift logic is configured to receive enable signals from a set of the number of N+1 clock gating cells and to generate a feedback signal, which is supplied to a gate enable input of the first one of the number of N+1 clock gating cells;
    a multiplexer configured to receive at input ports N+1 gated clock signals and to output a rotation clock signal, which has a frequency of 2/N of the frequency of the input clock signal,
    a frequency generator configured to receive the rotation clock signal and to generate an output clock signal having a frequency of 1/N.

2. The circuit according to claim 1,
    wherein a gate enable input of each one the number of N+1 clock gating cells is connected to an enable signal output of the directly preceding one of the number of N+1 clock gating cells, wherein a respective enable signal is fed from the enable signal output of each clock gating cell to the gate enable input of the directly preceding clock gating cell.

3. The circuit according to claim 1, further comprising:
    a multiplexer control logic configured to receive the rotation clock signal and to control a selective connection of one of the input ports to the output of the multiplexer based on the rotation clock signal.

4. The circuit according to claim 1, wherein the shift logic comprises:
    an NOR gate configured to receive the enable signals and to logically combine the received enable signals to generate a combined enable signal; and
    a gated latch configured to receive the combined enable signal at a data input and to receive the input clock signal at a clock signal input and to output the feedback signal an output.

5. The circuit according to claim 4, further comprising:
    wherein the set of the number of N+1 clock gating cells comprises N−3 clock gating cells first in sequence of the number of N+1 clock gating cells.

6. The circuit according to claim 4, wherein the multiplexer control logic comprises:
    a counter configured to detect an edge in the rotation clock signal and to cyclically count in response to an edge detection, wherein a counter value is supplied to the multiplexer as multiplexer selecting control signal, in response to which the multiplexer selectively connects a respective input port to the output.

7. The circuit according to claim 6,
    wherein the counter is a cyclic counter.

8. The circuit according to claim 6,
    wherein the counter is a Gray code counter.

9. The circuit according to claim 6,
    wherein the counter is arranged to detect a falling edge of the rotation clock signal.

10. The circuit according to claim 6,
    wherein the multiplexer control logic is arranged to control the multiplexer to cyclically connect the N+1 gated clock signals in reverse order according to the serial connection of the clock gating cells to the output.

11. The circuit according to claim 1,
    wherein the frequency generator comprises a gated latch clocked by the rotation clock signal and having a feedback path connecting on inverted output to a data input,
    wherein the output clock signal is present at an output of the gated latch.

12. The circuit according to claim 1,
    wherein the gated clock signals have a frequency of $$\frac{2}{N+1}$$

of the frequency of the input clock signal and a duty cycle factor $$\frac{1}{N+1},$$

wherein the enable signals have a frequency of $$\frac{2}{N+1}$$

of the frequency of the input clock signal and a duty cycle factor $$\frac{2}{N+1}.$$

13. The circuit according to claim 1,
    wherein the input clock signal has a duty cycle of 50%.

14. A method of dividing a frequency of an input clock signal by odd integer N, comprising:
    feeding an input clock signal into clock signal inputs of each one of a number of N+1 clock gating cells, wherein the N+1 clock gating cells are connected in series to each other in a shift register further comprising a shift logic;
    receiving at the shift logic enable signals from a set of the number of N+1 clock gating cells generating a feedback signal;
    supplying by the shift logic the feedback signal to a gate enable input of the first one of the number of N+1 clock gating cells;
    receiving at a multiplexer from the number of N+1 clock gating cells N+1 gated clock signals;
    outputting by the at a multiplexer a rotation clock signal, wherein the rotation clock signal has a frequency of 2/N of the frequency of the input clock signal;
    receiving at a frequency generator; and
    generating at the frequency generator an output clock signal having a frequency of 1/N.

15. The method of claim 14, further comprising:
    receiving at a multiplexer control logic the rotation clock signal and controlling by the multiplexer control logic a selective connection of one of the input ports to the output of the multiplexer based on the rotation clock signal.

* * * * *